(12) United States Patent
Mittelholzer et al.

(10) Patent No.: US 10,176,867 B2
(45) Date of Patent: *Jan. 8, 2019

(54) ESTIMATION OF LEVEL-THRESHOLDS FOR MEMORY CELLS

(71) Applicant: International Business Machines Corporation, Armonk, NY (US)

(72) Inventors: Thomas Mittelholzer, Zurich (CH); Nikolaos Papandreou, Thalwil (CH); Thomas Parnell, Zurich (CH); Charalampos Pozidis, Thalwil (CH); Milos Stanisavljevic, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/404,314

(22) Filed: Jan. 12, 2017

(65) Prior Publication Data

US 2017/0125095 A1    May 4, 2017

Related U.S. Application Data

(63) Continuation of application No. 14/722,278, filed on May 27, 2015, now Pat. No. 9,583,184.

(30) Foreign Application Priority Data

Jun. 17, 2014   (GB) .................................. 1410808.8

(51) Int. Cl.
*G11C 29/00*  (2006.01)
*G11C 13/00*  (2006.01)
(Continued)

(52) U.S. Cl.
CPC .......... *G11C 13/004* (2013.01); *G11C 7/1006* (2013.01); *G11C 11/56* (2013.01);
(Continued)

(58) Field of Classification Search
CPC ............. G11C 13/004; G11C 13/0004; G11C 13/0069; G11C 7/1006; G11C 11/56; G11C 11/5678
See application file for complete search history.

(56) References Cited

U.S. PATENT DOCUMENTS 6,055,181 A    4/2000  Tanaka et al.
8,482,978 B1   7/2013  Perlmutter et al.
(Continued)

FOREIGN PATENT DOCUMENTS

GB    2513592 A    11/2014
GB    2518632 A     4/2015
GB    2527318 A    12/2015

OTHER PUBLICATIONS

IBM: List of IBM Patents or Patent Applications Treated as Related (Appendix P), Jan. 12, 2017, pp. 1-2.
(Continued)

*Primary Examiner* — Samir W Rizk
(74) *Attorney, Agent, or Firm* — Alexis N. Hatzis

(57) ABSTRACT

Methods and apparatus are provided for determining level-thresholds for q-level memory cells. A group of the memory cells are read to obtain respective read signal components. The read signal components are processed in dependence on signal level to produce a signal level vector, comprising a series of elements, indicative of the distribution of read signal components in order of signal level. A plurality of possible sets of q−1 elements corresponding, respectively, to q−1 level-thresholds which partition the signal level vector into q segments, is then defined. The q−1 level-thresholds for the group of memory cells are then determined by selecting from said possible sets that set for which a predetermined difference function, dependent on differences in signal level for elements in each of said q segments for the set, has an optimum value.

20 Claims, 8 Drawing Sheets

(51) Int. Cl.
*G11C 7/10* (2006.01)
*G11C 11/56* (2006.01)

(52) U.S. Cl.
CPC ...... *G11C 11/5678* (2013.01); *G11C 13/0004* (2013.01); *G11C 13/0069* (2013.01); *G11C 2013/0054* (2013.01)

(56) References Cited

U.S. PATENT DOCUMENTS

| | | |
|---|---|---|
| 2008/0062769 A1 | 3/2008 | Blacquiere et al. |
| 2009/0292972 A1* | 11/2009 | Seol ................ G11C 16/26 714/763 |
| 2010/0165731 A1 | 7/2010 | Park |
| 2010/0321995 A1 | 12/2010 | Sarin |
| 2012/0140560 A1 | 6/2012 | Yang |
| 2013/0148436 A1 | 6/2013 | Kurosawa |
| 2013/0227380 A1 | 8/2013 | Mittelholzer et al. |
| 2013/0343131 A1 | 12/2013 | Wu et al. |
| 2015/0364189 A1 | 12/2015 | Mittelholzer et al. |

OTHER PUBLICATIONS

GB Application No. 1410808.8, filed Jun. 17, 2014, entitled: "Estimation of Level-Thresholds for Memory Cells", (33 pages).
GB Search Report, Application No. GB1410808.8, dated Dec. 8, 2014, (4 pages).

* cited by examiner

ESTIMATION OF LEVEL-THRESHOLDS FOR MEMORY CELLS

BACKGROUND

This invention relates generally to estimation of level-thresholds for memory cells. Methods and apparatus are provided for determining thresholds between successive cell levels on readout of q-level memory cells, together with data storage devices incorporating such apparatus.

In solid-state memory such as flash memory and phase-change memory, the fundamental storage unit (the "cell") can be set to q different states, or "levels", permitting storage of information. Each cell can be used to store a $q^{ary}$ symbol with each of the q possible symbol values being represented by a different cell level. In so-called "single-level cell" (SLC) devices, the memory cells can be set to only two levels (q=2) and so can record only binary values. Other devices use so-called "multi-level cells" which can be set to q>2 different cell levels, thus permitting storage of more than one bit per cell.

Detection of data stored in q-level memory cells relies on identifying the different cell levels on readback. In flash and phase change memory (PCM), for example, the different cell levels exhibit different electrical charge and electrical resistance characteristics respectively, and these can be detected via current or voltage measurements on the cells. On readout of cells, the read signal level can be compared with a set of reference signal levels indicative of the q cell levels in order to determine which level each cell is set to and thus detect the stored symbol value. A basic problem here is that the physical quantity measured during cell readout is subject to variability, e.g. due to noise and/or drift in measured values with time or cell usage. Multiple read operations on cells set to any given cell level will therefore yield a distribution of read signal levels.

Accuracy of the reference signal levels used for data detection is crucial to readback performance Reference signal levels can be expressed as "level-thresholds" for the q cell levels. For each pair of successive memory cell levels, the level-threshold indicates a read signal level defining the threshold, or boundary, between read signal level distributions corresponding to the two cell levels. The reference signal levels for detection of q-level cells can therefore be expressed as q−1 level-thresholds.

A conventional technique for reference level estimation uses training data derived from a pool of reference memory cells. Known information is written to the reference cells each time a block of user data is written to memory. The reference cells are read whenever the user file is read, and the reference cell readings are used to derive estimates for the reference signal levels. The reference cell approach has various disadvantages, including overhead due to use of memory area for reference purposes, and varying effectiveness due to inherent variability between cells in a memory array.

More sophisticated techniques for reference level estimation are self-adaptive, using the readback signals from cells storing actual user data to estimate the reference levels used for detection of data in those cells. Self-adaptive techniques for reference level estimation are described in our US Patent Application publication no. US 2013/0227380 A1 and our UK Patent Application no. 1307788.8, filed 30 Apr. 2013. These applications disclose systems for read-detection of length-N, $q^{ary}$-symbol codes in MLC memory. Each symbol of an N-symbol codeword is recorded in a respective q-level cell by setting the cell to a level dependent on the $q^{ary}$ symbol value. Memory cells are read in blocks to obtain read signals corresponding to a group of codewords. Each read signal has N read signal components corresponding to respective symbols of a codeword. The read signal components of the entire group of read signals are ordered according to signal value. The resulting ordered component sequence is then partitioned to obtain a plurality of segments each corresponding to a different memory cell level. The size (i.e. number of components) of each of these segments is determined based on predetermined frequency data indicative of expected frequency of occurrence of the corresponding level in use of the code. The resulting read signal level distributions corresponding to respective memory cell levels are then further processed to derive statistical data for use in the codeword detection process.

Another self-adaptive technique for estimating level-thresholds is described in our UK Patent Application no. 1317081.6, filed 26 Sep. 2013. The read signal components obtained by reading a block of q-level memory cells are processed in dependence on signal level to produce a signal level vector. This vector comprises a series of elements and indicates the distribution of read signal components in order of signal level. For example, the signal level vector can be produced by ordering the read signal components according to signal level, or by binning the components according to signal level. A sliding-window scan is performed on the signal level vector, and a metric, dependent on the elements of the signal level vector in the window, is calculated at each window position. The level-thresholds for the q cell levels are then determined based on variation of this metric over the scan. This technique performs well even in the presence of data asymmetry, i.e. where there is a significant difference in the numbers of cells set to the q different cell levels.

The foregoing self-adaptive techniques are a major advance on the reference cell approach, offering much-improved performance. As readback block sizes decrease, however, it becomes more difficult to meet the performance specifications for memory devices. In PCM devices, for example, in order to achieve the required bit error rates for specified data retention times, read detectors using current self-adaptive level-estimation systems require block sizes of at least 256 bits. This corresponds to 128 (q=4)-level cells. However, current PCM applications require block sizes of 64 bits or 128 bits, i.e. 32 or 64 $4^{ary}$ cells respectively, and further reduction in block size can be envisaged.

In view of the above, improved techniques for determining level-thresholds would be desirable.

SUMMARY

One embodiment of an aspect of the present invention provides a level-threshold determination method for q-level memory cells. The method reads a group of the memory cells to obtain respective read signal components; processes the read signal components in dependence on signal level to produce a signal level vector, including a series of elements, indicative of the distribution of read signal components in order of signal level; defines a set of possible sets of q−1 said elements corresponding, respectively, to q−1 level-thresholds which partition the signal level vector into q segments; and determines the q−1 level-thresholds for said group of memory cells by selecting from said possible sets that set for which a predetermined difference function, dependent on differences in signal level for elements in each of said q segments for the set, has an optimum value.

An embodiment of a second aspect of the invention provides apparatus for level-threshold determination on readout of q-level memory cells. The apparatus includes working memory for storing respective read signal components obtained by reading a group of said q-level memory cells, and control logic adapted to: process the read signal components in dependence on signal level to produce a signal level vector, including a series of elements, indicative of the distribution of read signal components in order of signal level; defining a set of possible sets of q−1, said elements corresponding, respectively, to q−1 level-thresholds which partition the signal level vector into q segments; and determine the q−1 level-thresholds for said group of memory cells by selecting from said possible sets that set for which a predetermined difference function, dependent on differences in signal level for elements in each of said q segments for the set, has an optimum value.

An embodiment of a third aspect of the invention provides a data storage device including a non-transitory memory having q-level memory cells; a read/write apparatus for writing $q^{ary}$ symbols in respective memory cells and for reading memory cells to obtain respective read signal components each corresponding to a said symbol; a level-threshold determination apparatus according to the second aspect of the invention for receiving read signal components for a group of memory cells and determining therefrom q−1 level-thresholds for the group; and a detector for detecting $q^{ary}$ symbols corresponding to said read signal components in dependence on the level-thresholds so determined.

BRIEF DESCRIPTION OF DRAWINGS

Where features are described herein with reference to an embodiment of one aspect of the invention, corresponding features may be provided in embodiments of another aspect of the invention as appropriate.

Preferred embodiments of the invention will now be described, by way of example, with reference to the accompanying drawings in which.

DETAILED DESCRIPTION

Figure 1:
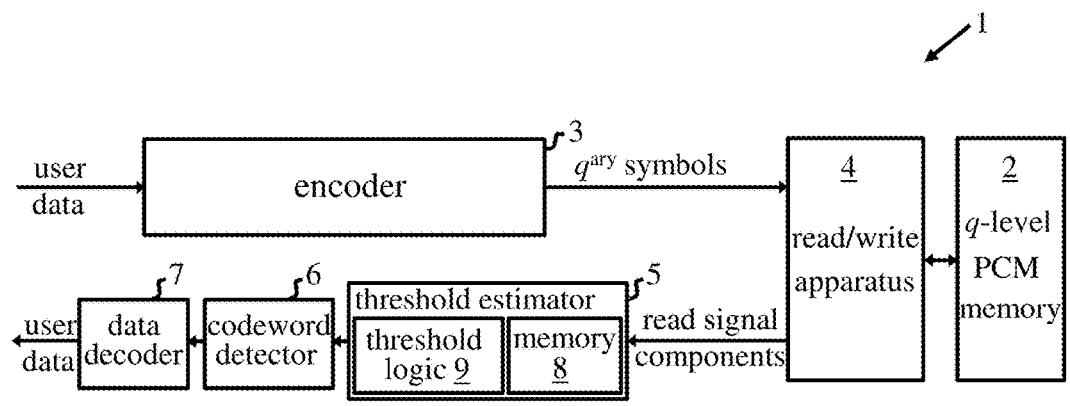
FIG. 1 is a schematic block diagram of a data storage device embodying the invention.

FIG. 1 is a simplified schematic of a data storage device, here a phase-change memory (PCM) device 1, embodying the invention. The device 1 includes phase-change memory 2 for storing data in one or more integrated arrays of multilevel PCM cells. Each of the PCM cells in memory 2 can be set to one of q>2 nominal levels, designated $l_1$ to $l_q$ herein, by adjusting the resistance of the cell in known manner Though shown as a single block in the figure, memory 2 may comprise any desired configuration of PCM storage units ranging, for example, from a single chip or die to a plurality of storage banks each containing multiple packages of storage chips. Device 1 includes an encoder 3 for encoding input user data as discussed below. Read/write apparatus 4 controls writing of the resulting codewords in memory 2, and subsequent reading of memory cells to obtain read signals corresponding to the codewords. The decoding apparatus of device 1 includes a threshold estimator 5, a codeword detector 6 and a data decoder 7. The threshold estimator 5 includes working memory 8 for storing the read signals output by read/write apparatus 4, and control logic 9 which comprises functionality for determining level-thresholds for the q cell levels as described in detail below. Codeword detector 6 uses the resulting level-thresholds to detect codewords corresponding to the read signals, and data decoder 7 decodes the detected codewords to recover the original user data.

As will be appreciated by those skilled in the art, functionality of the encoding and decoding apparatus 3, 5, 6, 7 of device 1 may be implemented in practice by control circuitry of a memory device, e.g. a memory chip, which forms part of memory 2, or by a separate device, such as a memory controller, which controls a set of memory devices in memory 2. In a typical arrangement, the functionality may be implemented via a combination of control logic in a memory controller and individual memory devices. In general, functionality of the encoding/decoding apparatus may be implemented in hardware, software or a combination thereof. Suitable implementations will be apparent to those skilled in the art from the description herein. In particular, the control logic 9 of threshold estimator 5, which implements the various steps of the level-threshold determination process detailed below, may be embodied in hardware or software or a combination of hardware and software components. For example, the threshold determination process could be performed in whole or in part by software which configures a computer to implement the functionality described, and suitable software will be readily apparent to those skilled in the art. For reasons of operating speed, however, the use of hardwired logic circuits is generally preferred to implement the threshold estimator functionality. Again, suitable implementations will be readily apparent from the description of operation herein.

In operation of device 1, the input user data to be recorded in memory 2 is supplied to encoder 3. The encoder 3 encodes the input data into codewords of a predetermined $q^{ary}$-symbol code. Hence, each codeword contains a plurality of symbols each of which can take one of q possible values. Any desired $q^{ary}$-symbol code may be employed here, and in general the encoding process may involve error-correction and/or modulation coding of input data or simple mapping of binary input data into $q^{ary}$ symbols without further encoding of the user data.

The $q^{ary}$-symbols of codewords output by encoder 3 are written to memory 2 by read/write apparatus 4. In a write operation, each symbol is stored in a respective cell of memory 2. The q possible symbol values correspond to respective predetermined levels $l_1$ to $l_q$ of the q-level memory cells. Each memory cell is thus set to a level dependent on the symbol value to be stored in accordance with a predefined mapping of symbol values to cell levels. (Note that, when setting a cell to a given level, the actual resistance value x assumed by the cell may lie within a small interval around the nominal resistance value for the level due to write noise).

To read a cell in a subsequent read operation, a small probing signal is applied to the cell to obtain a readback signal indicative of cell resistance. Various read metrics can be employed here. For example, current-based metrics can be obtained by measuring the current flowing through the cell for a fixed applied voltage. Voltage-based metrics can be obtained by measuring voltage developed across the cell on applying a known current, where a fixed or variable threshold current may be used in generating the metric. In any case, the resulting cell readback signal provides a metric for the cell-level and hence the stored symbol value. In a read operation, a group of N memory cells are read to obtain N read signal components $y_k$, k=1, 2, ..., N, indicating the read metric values for the sequence of cells storing N codeword symbols. The read signal components thus correspond to respective symbols of a codeword. The N read signal components $y_k$ are processed in threshold estimator 5 to determine a current set of level-thresholds for the q memory cell levels. Codeword detector 6 detects codewords corresponding to the current group of components based on the level-thresholds determined by level estimator 5 for that group. Data decoder 7 then decodes the detected codewords by performing the inverse of the encoding performed in encoder 3, thus recovering the original input data.

Figure 2:
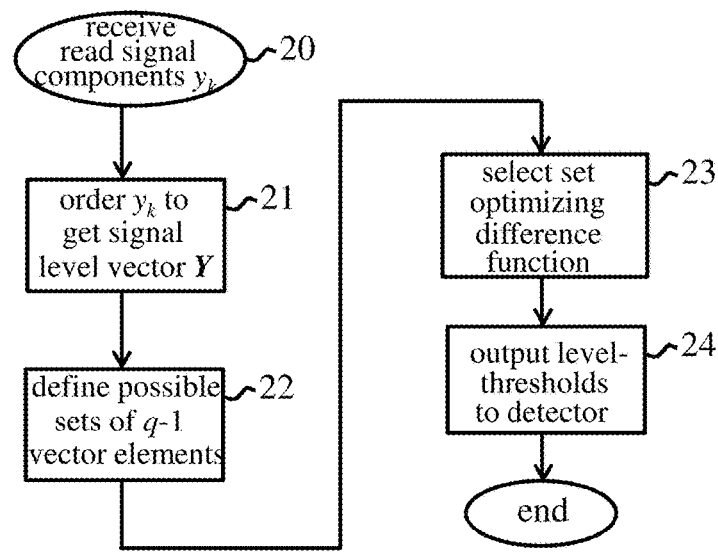
FIG. 2 indicates operation of a threshold estimator in the FIG. 1 device.

FIG. 2 is a generalized block diagram giving an overview of the level-threshold determination process performed by threshold estimator 5. Operation begins, as indicated at step 20, on receipt of the read signal components $y_k$, k=1, 2, ..., N for the current group of memory cells. The read signal components $y_k$ are stored in working memory 8. In step 21, the stored read signal components are processed by threshold logic 9 to produce a signal level vector. This signal level vector comprises a series of elements indicative of the distribution, or spread, of read signal components in order of signal level. In the preferred embodiments to be described, the signal level vector is produced by ordering the N read signal components according to signal level. The read signal components are ordered in order of increasing signal level here, so that the resulting signal level vector Y has a series of elements $Y_k$, k=1, 2, ..., N where $Y_1 \leq Y_2 \leq Y_3 \ldots \leq Y_N$. The vector Y is then stored in working memory 8 for further processing.

Figure 3:
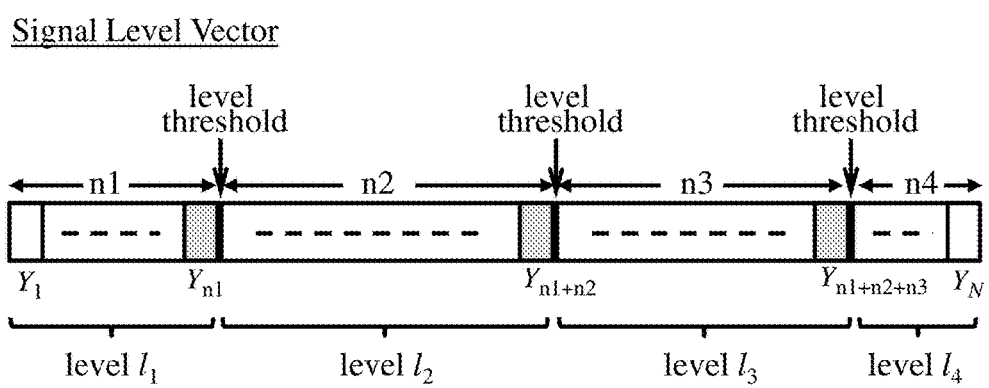
FIG. 3 illustrates partitioning of a signal level vector in operation of the threshold estimator.

The goal of the threshold-determination process is effectively to partition the signal level vector into q segments, containing n1, n2, ..., nq elements respectively, corresponding to respective memory cell levels $l_1$ to $l_q$. This principle is illustrated schematically in FIG. 3 for an example with q=4 cell levels $l_1$ to $l_4$. This process involves identifying (q−1) elements $Y_k$ in the signal level vector Y which mark the thresholds (shown in bold in the figure) between successive cell levels. These elements, corresponding to respective level thresholds, are referred to hereinafter as "threshold elements". A set of three such threshold elements, identified by indices k=n1, k=(n1+n2), and k=(n1+n2+n3), are indicated by shading in the figure. The level-threshold determination process involves selecting a set of q−1 threshold elements from possible sets of q−1 elements which could correspond to level thresholds in the signal level vector. Hence, returning to block 22 of FIG. 2, a plurality of possible sets of q−1 vector elements are defined in threshold estimator 5 and, in step 23, one of these sets is selected as the set of q−1 threshold elements. The threshold element set is selected from the possible sets of q−1 elements as that set for which a predetermined difference function, defined in the level estimator 5, has an optimum value. This difference function is dependent on differences in signal level for elements in each of the q segments into which the signal level vector is partitioned by a given set of q−1 vector elements. More particularly, in the embodiments to be described, the difference function is dependent on differences in signal level for elements within each of the q segments. The set of q−1 vector elements which minimizes the difference function is then selected in step 23 as the set corresponding to the level-thresholds. In step 24, the level thresholds are output to the detector 6. The level thresholds may be defined here by the indices k=n1, k=(n1+n2), and k=(n1+n2+n3) of the threshold elements in the signal level vector or, for example, by the set of numbers (n1, n2, n3, n4) indicating the size of the segments into which the vector is partitioned by the level thresholds corresponding to the threshold elements. The threshold estimation processing is then complete.

In a first class of embodiments, the possible sets of q−1 elements defined in block 22 of FIG. 2 are actively selected as a subset of all possible sets of q−1 elements for the level thresholds. In the particular embodiments to be described, the possible sets are selected via a process involving hierarchical partitioning of the signal level vector. In a first step of this process, corresponding to a first hierarchical level of partitioning, the signal level vector is processed in accordance with a first threshold-estimation process to obtain L>1 candidate subsets of $1 \leq r < (q-1)$ elements corresponding to respective level-thresholds which partition the signal level vector into (r+1) sections. A second hierarchical level of partitioning is then performed for the (r+1) sections produced by each of the L candidate subsets. For each candidate subset, the (r+1) sections are processed in accordance with a second threshold-estimation process to obtain ((q−1)−r) elements corresponding to the remaining level-thresholds for that subset. This results in L candidate sets of q−1 elements which provide the possible sets for the final selection step. Where, as is generally the case, q is a power of two, the hierarchical partitioning process is conveniently implemented by hierarchical dichotomization of the signal level vector. A first embodiment of a threshold estimator implementing such a process will now be described with reference to FIGS. 4 and 5. In this example, it is assumed that q=4 and r=1.

Figure 4:
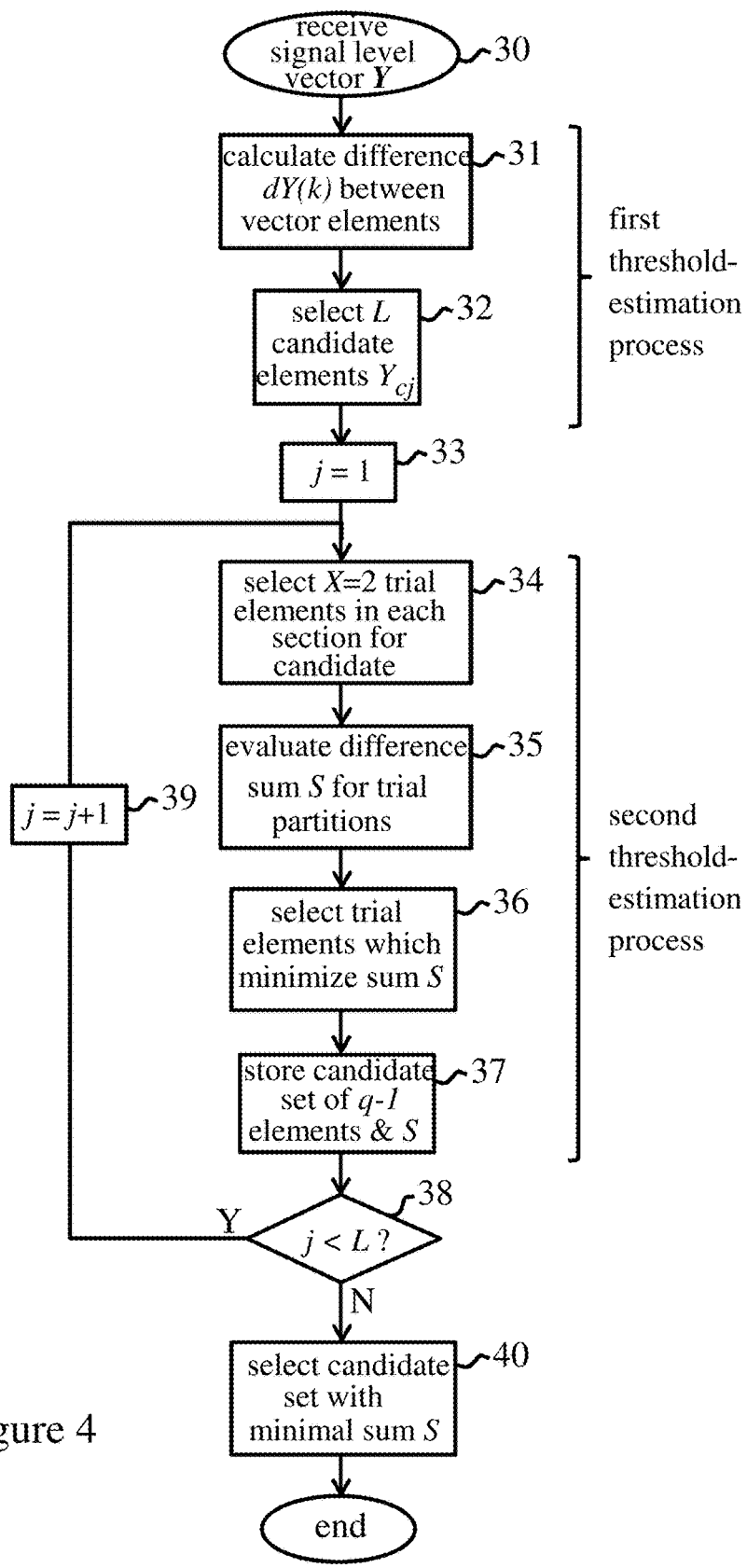
FIG. 4 indicates more detailed operation of a first embodiment of the threshold estimator.

FIG. 4 gives a more detailed breakdown of steps 22 and 23 in FIG. 2 for the first embodiment. Operation commences, as indicated at step 30, with input to threshold logic 9 of the signal level vector stored in memory 8. In step 31, the threshold logic calculates differences between successive elements in the signal level vector as:

$dY(k)=Y(k+1)-Y(k)$ for k=1, ..., N−1.

Figure 5:
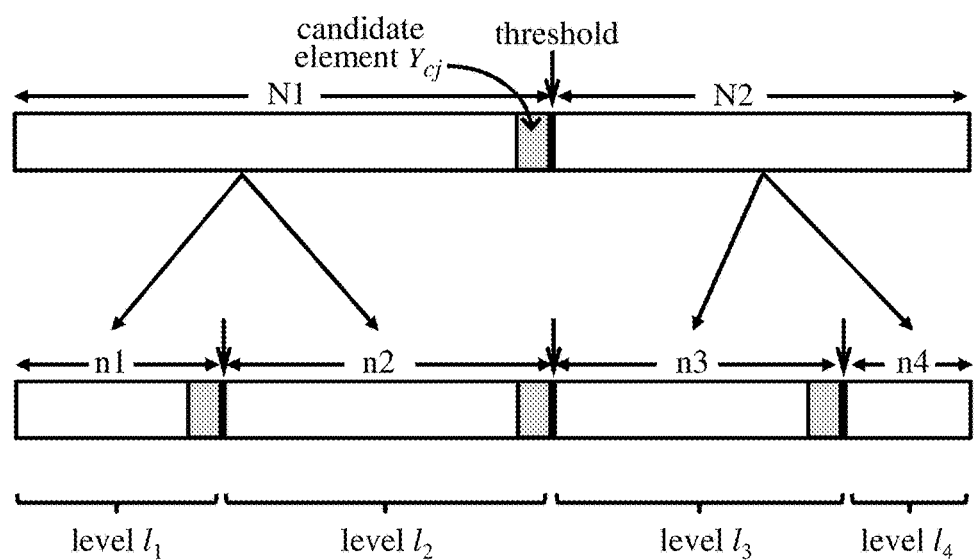
FIG. 5 illustrates hierarchical partitioning of a signal level vector in operation of the first embodiment.

Next, in step 32, the threshold logic selects L candidate subsets of r=1 element, (hereinafter referred to as L "candidate elements") corresponding to respective level-thresholds which partition the signal level vector into r+1=2 sections. The L candidate elements are selected here by identifying the indices k=c1, c2, ..., cL of the vector elements $Y_k$ having the L greatest differences to the succeeding element, i.e. the L elements with the L highest values of dY(k). Each candidate element $Y_{cj}$ (j=1 to L) corresponds to a possible level threshold which partitions the signal level vector into two sections containing N1=cj and N2=N−cj elements respectively. This is indicated at the top of FIG. 5 and corresponds to a first level of the hierarchical dichotomization process.

The next stage of the process is performed for each of the candidate elements $Y_1$ in turn. Thus, initially for j set to 1 in step 33, the threshold logic 9 processes the two sections of N1 and N2 elements defined by the candidate element $Y_{c1}$ in accordance with a second threshold estimation process. This involves selecting from each section of N1 and N2 elements, X trial elements which have the X greatest differences dY to the succeeding element in that section. In this example, X=2. Hence, in step 34, the indices k1, k2 of the two trial elements with the greatest dY values are identified in the first section of N1 elements, and the indices m1, m2 of the two trial elements with the greatest dY values are identified in the second section of N2 elements. Step 34 results in four trial partitionings P(n1, n2, n3, n4) of the signal level vector into q=4 segments of size (n1, n2, n3, n4) as follows:

$$P1 = (k1, N1-k1, m1, N2-m1)$$

$$P2 = (k1, N1-k1, m2, N2-m2)$$

$$P3 = (k2, N1-k2, m1, N2-m1)$$

$$P4 = (k2, N1-k2, m2, N2-m2)$$

For the candidate element $Y_{c1}$, the two further elements corresponding to the remaining two level-thresholds (which partition the sections of N1 and N2 elements into two segments) are then selected as the pair of trial elements which minimize a sum S over the q=4 segments of a distance function. That is, the partition P which minimizes the distance function is identified to determine the remaining elements of the candidate set. In this example, the distance function comprises the (weighted) L1 distance of elements within a segment from an average value, here the median value, for that segment. The sum S for a partition P is given here by:

$$S(P) = w_1 \cdot \sum_{k=1}^{n1} |Y_k - \mu_1| + w_2 \cdot \sum_{k=n1+1}^{n1+n2} |Y_k - \mu_2| + w_3 \cdot \sum_{k=n1+n2+1}^{n1+n2+n3} |Y_k - \mu_3| + w_4 \cdot \sum_{k=n1+n2+n3+1}^{N} |Y_k - \mu_4|$$

where $\{w_i\}$ are weighting parameters used to weigh the L1 distance for each segment, and $\{\mu_i\}$ are medians of the set of element values $\{Y_k\}$ in each segment. While the weights may be determined in a variety of ways here, in this example the weights are dependent on the inverse of the variance of the element values $\{Y_k\}$ in each segment.

Returning to step 35 of FIG. 4, the sum S for each partition P is thus evaluated for the current candidate element $Y_{c1}$ determined by the first level of the hierarchical dichotomization process. In step 36, the pair of trial elements corresponding to the remaining two level-thresholds are determined by the pair of indices k1, k2 and m1, m2 in the partition P for which the sum S has the minimum value. These trial elements partition each of the sections of N1 and N2 elements produced by candidate element $Y_{c1}$ into four segments of size (n1, n2, n3, n4). This constitutes a second level of the hierarchical dichotomization process as indicated at the bottom of FIG. 5 where the resulting candidate set of (q−1)=3 threshold elements is indicated by shading. The indices of these threshold elements (or equivalently the corresponding segment sizes n1, n2, n3, n4), are then stored at step 37 together with the associated sum value S.

The second threshold estimation process of steps 34 to 37 is then repeated for each further candidate element $Y_{c2} \ldots Y_{cL}$ determined by the first threshold estimation process above. Hence the index j is incremented in step 39 and operation reverts to step 34 for the next candidate element. When j=L in decision step 38, L candidate sets of q−1 threshold elements are defined in memory 8. In step 40, the threshold logic selects from these candidate sets that set which has the minimum sum value S. This set determines the q−1 level-thresholds for the current group of memory cells. In this embodiment, therefore, the difference function in step 23 of FIG. 2 corresponds to the sum S which is evaluated for all candidate sets as part of the second threshold estimation process.

The number L of candidates in the above process may be selected as desired, e.g. according to the size N of the group of cells in a read operation. By way of example, for an (N=32)-element signal level vector in the above embodiment, a value of L=6 has been found suitable.

The q−1 level-thresholds determined by the above process are used by detector 6 to detect codewords stored in the N cells for the read operation. Detection of codewords based on the level-thresholds can be performed in a variety of ways. In a simplistic implementation, for example, the level-thresholds could be used directly for codeword detection by mapping the read signal components $y_n$ to respective cell levels, and hence symbol values, in accordance with the level thresholds. In more sophisticated systems, the level thresholds can be used to calculate statistical data for the distribution of read signal components determined as corresponding to each of the memory cell levels in accordance with the calculated level-thresholds. For example, the mean values $\lambda_1$ to $\lambda_q$ and standard deviations $\sigma_1$ to $\sigma_q$ can be calculated from the distributions for the cell levels $l_1$ to $l_q$. The codeword corresponding to each read signal can then be detected based on this statistical data. For example, codeword detector 6 may perform one or more stages of codeword detection using a technique such as ML (maximum-likelihood), MAP (maximum-a-posteriori) or MD (minimum distance) decoding. Particular examples of such detection processes are detailed in our copending US patent application and UK Application No. 1307788.8 referenced above, the relevant contents of which are incorporated herein by reference. In general, however, any desired detection technique can be employed based on the level-thresholds determined by threshold estimator 5, and suitable implementations for codeword detector 6 will be readily apparent to those skilled in the art.

Figure 6:
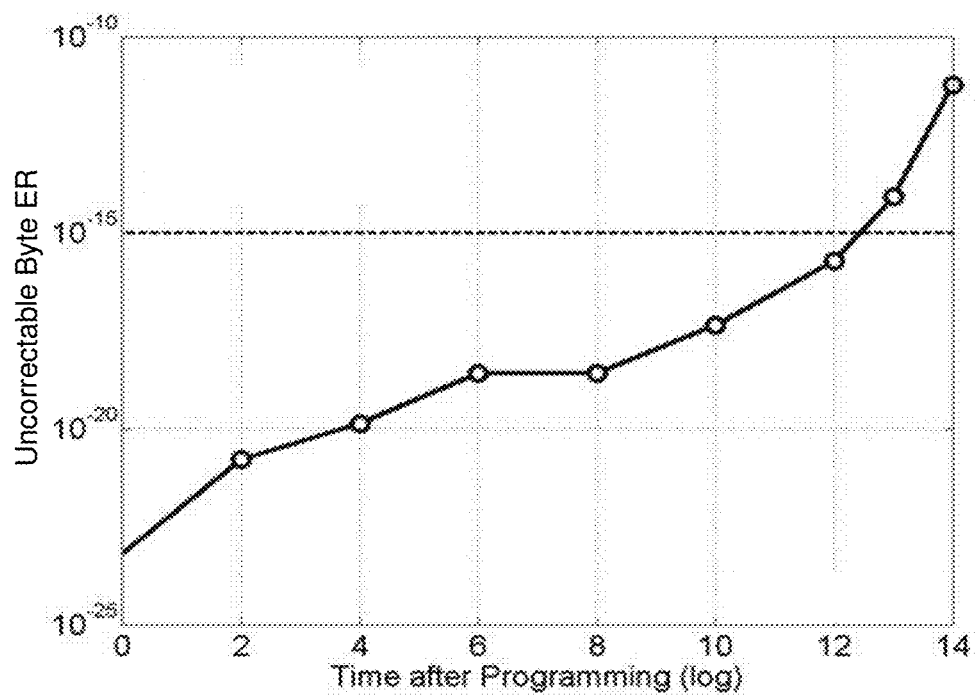
FIG. 6 indicates device error performance with the first embodiment of the threshold estimator.

The above level-threshold estimation technique provides excellent readback performance even for small block sizes N. As illustration, FIG. 6 plots the byte error rate obtained at the decoder output as a function of retention time, i.e. time elapsed after cell programming, (and hence increasing level drift) based on statistical modelling of 90 nm (q=4)-level PCM cells using a voltage-based read metric with variable threshold current. A block size of 64 bits (N=32) is used, with L=6, in conjunction with an error-correction code in encoder 3 which permits correction of up to eleven byte errors over eight 64-bit blocks. It can be seen that, with the target UBER (uncorrectable byte error rate) of $10^{-15}$, retention exceeds 12 orders of magnitude in time after programming. This is exceptional performance with such a small readback block size, and a significant improvement over prior systems. Moreover, the threshold estimation technique can be implemented with low system complexity, and offers robustness to data asymmetries in the user data as well as enhanced operation at small block sizes.

Various modifications can be made to the first embodiment described above. For instance, step 35 in FIG. 4 could evaluate an alternative difference function for the candidate sets of threshold elements. An example here is a difference function comprising the L2 distance (weighted or unweighted) of elements in each segment. Hence the level-threshold might be determined by selecting the candidate set which minimizes the following difference sum S2:

$$S2 = w_1 \cdot \sum_{k=1}^{n1} (Y_k - \mu_1)^2 + w_2 \cdot \sum_{k=n1+1}^{n1+n2} (Y_k - \mu_2)^2 + w_3 \cdot \sum_{k=n1+n2+1}^{n1+n2+n3} (Y_k - \mu_3)^2 + w_4 \cdot \sum_{k=n1+n2+n3+1}^{N} (Y_k - \mu_4)^2$$

where the various parameters are as specified above. The process can also be readily extended to q>4, and also r>1 candidate in the first level estimation process. For example, where q>4, the first level estimation process could be repeated for a plurality of hierarchical dichotomization stages, with the second process being performed for the final dichotomization stage.

Figure 7:
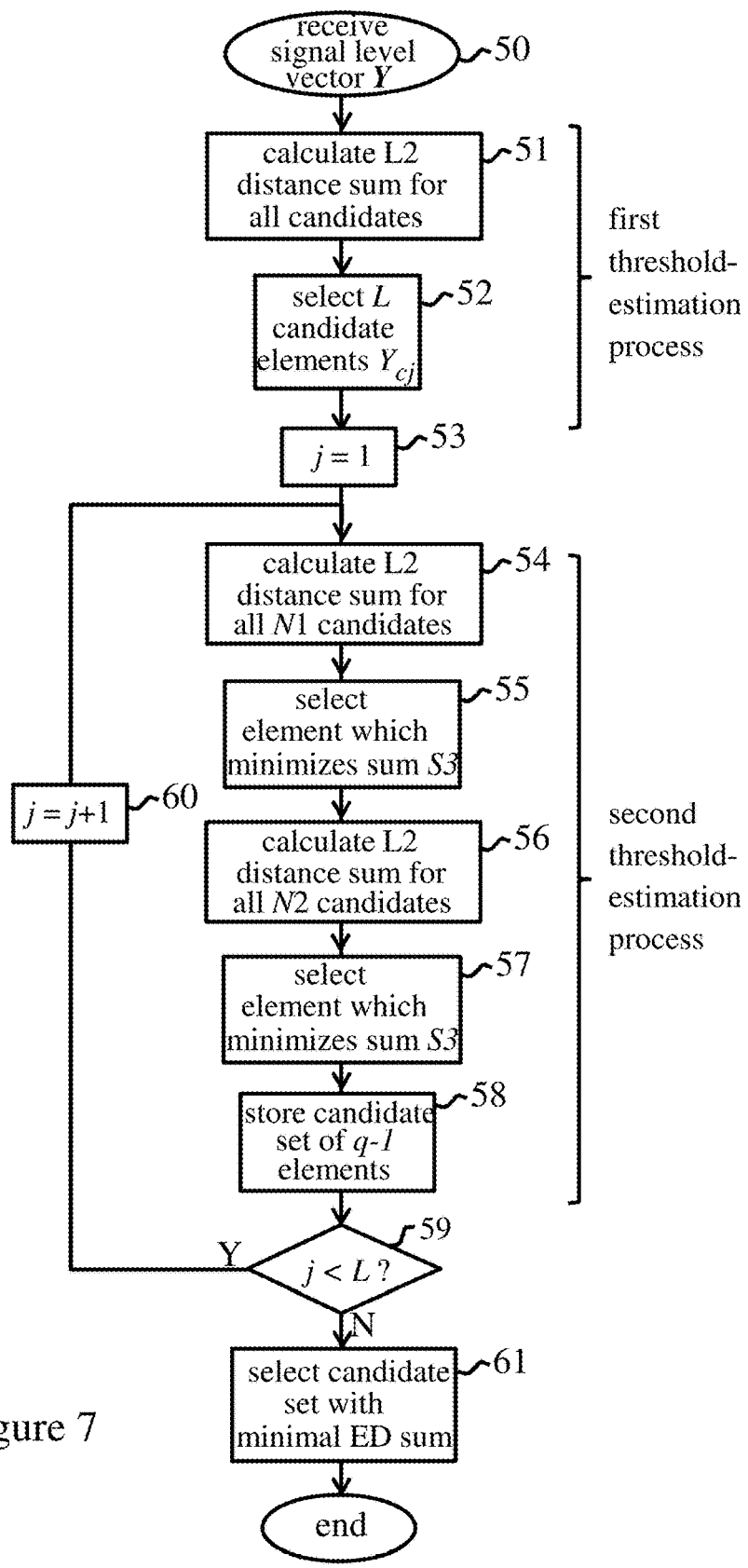
FIG. 7 indicates detailed steps in operation of a second embodiment of the threshold estimator.

Other embodiments may use different techniques for the first and/or second level estimation processes of the hierarchical partitioning. FIG. 7 is a flow chart equivalent to FIG. 4 for one such embodiment. In this second embodiment, the first threshold estimation process identifies L candidate elements corresponding to a level threshold which partitions the signal level vector into two sections as before. In this case however, candidate elements for the level threshold are successively identified by selecting the element which minimizes a sum, over the sections of the signal level vector produced by the level-threshold, of a distance function comprising the L2 distance (Euclidean distance (ED)) of elements within a section from an average value for that section. This ED distance function may be defined by a sum S3 as follows:

$$S3 = \sum_{k=1}^{N1}(Y_k - \mu_1)^2 + \sum_{k=N1+1}^{N}(Y_k - \mu_2)^2$$

where the parameters are as specified above. A weighted L2 distance function might also be used here if desired. As indicated at step 50 of FIG. 7 for this embodiment, operation commences. In step 51, the ED distance function S3 is evaluated for all possible candidate elements. In step 52, the L candidate elements with the L minimum values of S3 are successively selected from the results. In step 53, j is initially set to 1. For each candidate element, the second threshold-estimation process then processes the two sections of N1 and N2 elements, into which the signal level vector is partitioned by the corresponding threshold, in turn. In step 54, the ED distance function S3 is evaluated for all possible elements which partition the first section of N1 elements into two segments. In step 55, the element minimizing the sum S3 is selected as the element corresponding to one of the two remaining level-thresholds. In step 56, the ED distance function S3 is evaluated for all possible elements which partition the second section of N2 elements into two segments. In step 57, the element minimizing the sum S3 is selected as the element corresponding to the last remaining level-threshold. The resulting candidate set of three threshold elements are then stored in step 58. Index j is incremented in step 60. When all L candidate sets have been identified (step 59), the final level thresholds are identified in step 61 by evaluating the ED distance function over all four segments of size n1, n2, n3, n4 corresponding to each candidate set. For example, the sum S2 above, with or without weighting, may be used in this step.

Figure 8A:
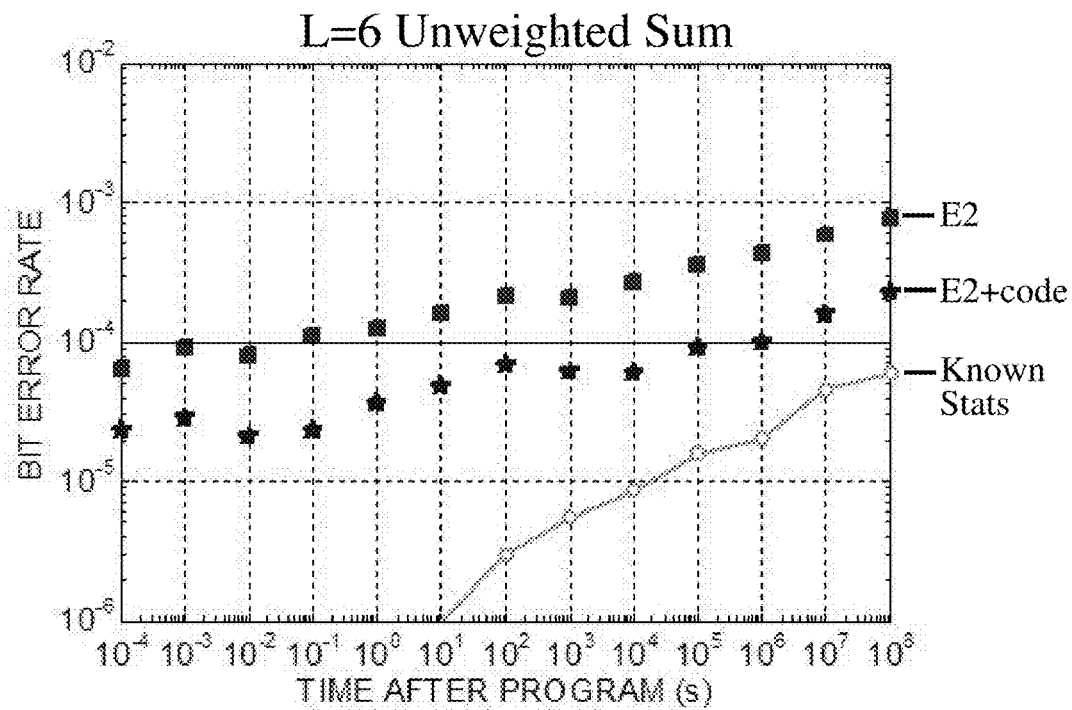
FIGS. 8a and 8b indicate device error performance with the second embodiment of the threshold estimator using unweighted and weighted difference functions respectively.
Figure 8B:
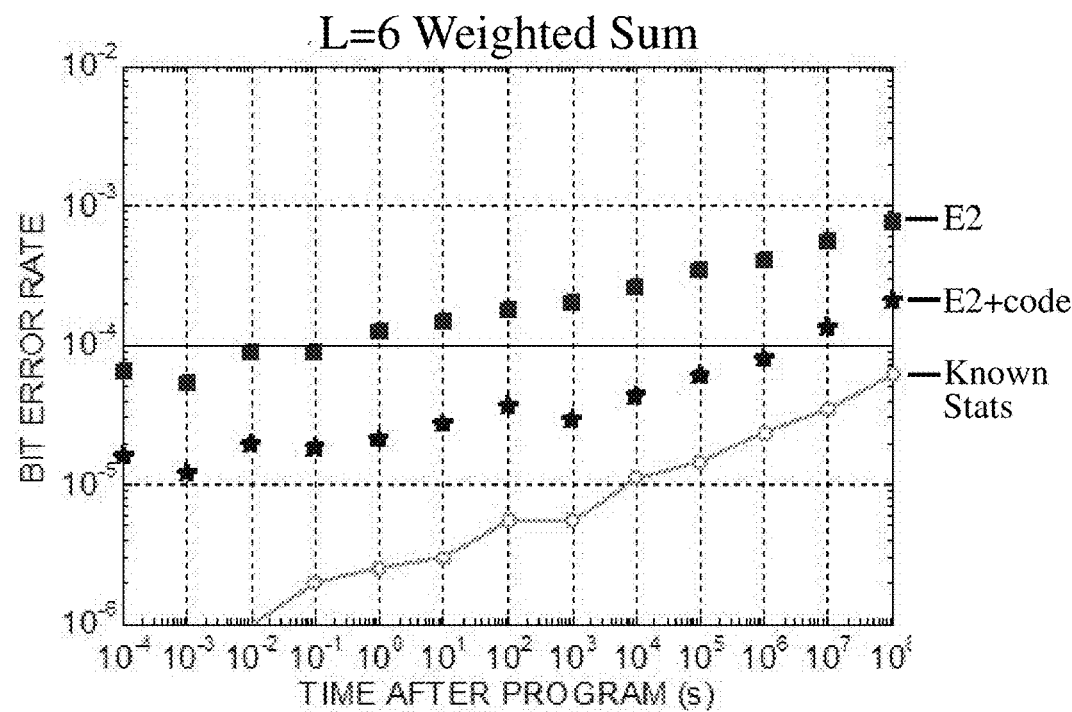

FIGS. 8*a* and 8*b* show performance results obtained with a method corresponding to FIG. 7 using unweighted and weighted sums respectively in the Euclidean distance functions. The weights used here were dependent on the inverse of the variance of elements for each level as discussed above. The graphs show simulated results for bit-error rate at the decoder output versus time for (q=4)-level PCM cells and a block size of 128 bits (N=64). A voltage-based read metric is used as before, and L=6 candidate threshold sets were employed. Each graph shows performance of the FIG. 7 method without benefit of modulation coding in encoder 3 (trace labelled "E2") and also with modulation coding (trace "E2+code"). For comparison, the trace labelled "Known Stats" shows results obtained assuming perfect knowledge of the level statistics at all times. It can be seen that both weighted and unweighted methods perform well, especially with coding, at this small block size, with the weighted method performing slightly better. It has been found that the weights used here can be heavily quantized, e.g. to 2 bits, to reduce implementation complexity without loss of performance.

Modifications of the second embodiment may use the L1 distance (again weighted or unweighted) in the sum function used in one or more of the processing steps. Various alternative first and second threshold estimation processes might also be employed. For example, in other embodiments the first threshold estimation process may be based on the sliding-window technique described in our UK Application no. 1317081.6 referenced above (the content of which is incorporated herein by reference). In particular, the L biggest local maxima in the metric values calculated over the scan can be used to identify the L candidate elements for the first level of partitioning. As another example, the second threshold estimation process may identify the two further elements of the candidate set, one from each section of N1 and N2 elements, by calculating the difference between successive elements in the section and selecting the elements with the greatest difference to the succeeding element. Various other level estimation processes, using a variety of distance functions can also be envisaged.

The above embodiments define a subset of all possible sets of q−1 threshold elements for use in the final selection step. Embodiments can be envisaged, however, wherein the plurality of possible sets from which the final selection is made comprises all possible sets of q−1 elements corresponding to respective level-thresholds. In particular for small values of N (e.g. N=32), the threshold elements defining a clustering n1, . . . nq that optimizes (e.g. minimizes) a predetermined difference function, such as a Euclidean distance function, can be determined in an optimal way so that the global minimum is always found. (The constraint on N here depends on available processing resources as complexity increases with increasing N value). This can be achieved by defining a graph comprising an array of nodes, arranged in (N+1) states and (q+1) timeslices, interconnected by branches such that each path across the graph via interconnected nodes represents one of the possible sets of q−1 elements. Each branch is assigned a respective metric such that the metrics assigned to branches in a path indicate the value of the difference function to be evaluated for the corresponding set of q−1 elements. The optimization problem can then be solved by recursive processing on the graph using a known path selection algorithm such as the Viterbi algorithm, thus identifying the path for which the difference function has an optimal value. An example of such a process is described below with reference to FIG. 9.

This embodiment aims to find the set of threshold elements defining segments of size $n_1, \ldots n_q$ which minimizes the objective function:

$$S(n_1, \ldots n_q) = \sum_{i=1}^{q} \sum_{k \in s_i} (Y_k - m_i)^2$$

where $s_i$ is the segment correspond to cell level i and $m_i$ is an average value (e.g. mean) of elements $Y_k$ in the segment. (Again weighting could be used in this sum if desired). This minimization problem can be solved recursively on a graph using the Viterbi algorithm. The elements $Y_k$ of the signal level vector are sorted in ascending signal level order as before. The control logic 9 of threshold estimator 5 defines a trellis with (N+1) states and (q+1) time-slices. The states at time slice i=0, ..., q are labeled by all possible values of the running sum $\lambda$:

$$\lambda(n_1, \ldots n_i) = \sum_{j=1}^{i} n_j, \lambda_0 = 0 \lambda(n_1, \ldots n_q) = \sum_{j=1}^{q} n_j = N$$

State $\lambda_{i-1}$ is connected by a branch to state $\lambda_i$ if:

$$\lambda_i - \lambda_{i-1} \geq 0$$

Figure 9:
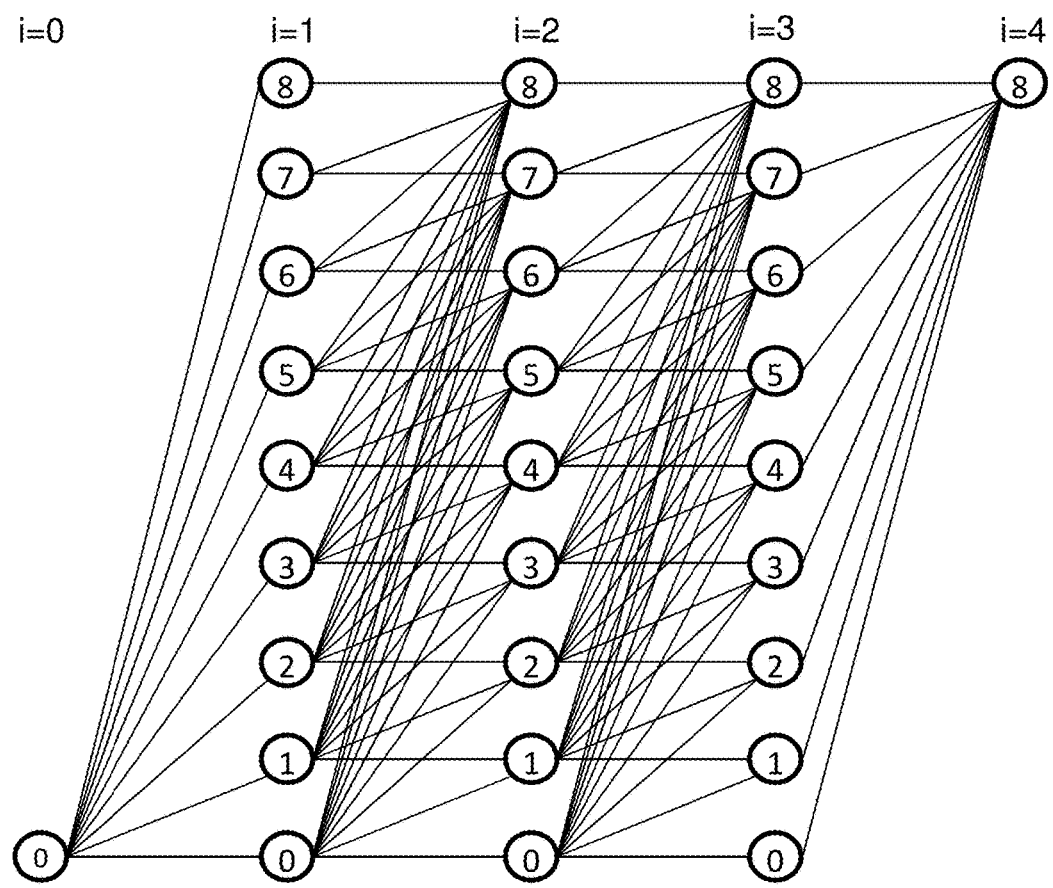
FIG. 9 shows a graph used for determining level-thresholds in a third embodiment of the threshold estimator.

Such a trellis is illustrated in FIG. 9 for a simple example with N=8 and q=4.

Each branch connecting state $\lambda_{i-1}$ to $\lambda_i$ is assigned weight ('branch metric') as follows:

$$BM(\lambda_{i-1}, \lambda_i) = \sum_{k=\lambda_{i-1}+1}^{\lambda_i} (Y_k - m(\lambda_{i-1}, \lambda_i))^2$$

$$\text{where } m(\lambda_{i-1}, \lambda_i) = \frac{1}{\lambda_i - \lambda_{i-1}} \sum_{k=\lambda_{i-1}+1}^{\lambda_i} Y_k$$

(Other average values, such as a median value, may be used instead of the mean $m(\lambda_{i-1}, \lambda_i)$ here if desired). The threshold logic 9 can then apply the Viterbi algorithm in known manner to compute the path of minimal weight recursively. The weight of the best path leading to state $\lambda_i$ at time slice i is given by:

$$PM_i(\lambda_i) = \min_{\lambda, i-1 \leq \lambda, i} [PM_{i-1}(\lambda_{i-1}) + BM(\lambda_{i-1}, \lambda_i)]$$

The state from which the minimal path arrived is also stored at each state so that, after all time slices have been processed, it is possible to trace-back for the minimal path:

$$\hat{\lambda}_0, \hat{\lambda}_1, \hat{\lambda}_2, \ldots, \hat{\lambda}_q$$

Here $\hat{\lambda}_1, \hat{\lambda}_2, \ldots, \hat{\lambda}_{q-1}$ correspond to the indices of the threshold elements defining the level thresholds. The numbers of elements, and hence cells in the N-cell read block, corresponding to each cell level are given by:

$$n_i = \hat{\lambda}_i - \hat{\lambda}_{i-1}.$$

Other difference functions, e.g. an L1 distance function, can of course be used in modified versions of the above process.

Various further changes and modifications can be made to the exemplary systems described above. For example, in some embodiments the signal level vector may be produced by binning the N read signal components according to signal level. That is, a series of "bins", each corresponding to a particular signal level value (or range of values), is defined in threshold logic 9, and each read signal component is assigned to the appropriate bin according to its signal level. The input read signal components are typically already quantized, being produced at the output of an analogue-to-digital converter (ADC) in read-write apparatus 4. In a simple implementation, therefore, the threshold logic may use as many bins as there are signal component levels at the ADC output. (Alternatively, fewer bins could be employed, each bin corresponding to a range of signal component levels). The resulting bin counts thus indicate the numbers of components with the corresponding levels. Arranged in order of increasing (or decreasing) signal level, these bin counts thus provide a histogram of the distribution of read signal components by signal level. Operation of the above processes is entirely equivalent using a signal level vector determined by the ordered bin counts.

As another example, hierarchical partitioning methods can be employed which do not use a plurality L of candidate elements. Such a method might simply determine a plurality of possible sets of (q−1) elements by processing the signal level vector in accordance with a first threshold-estimation process to obtain $1 \leq r < (q-1)$ elements of each possible set. Hence, the first threshold-estimation process identifies a subset of r of the q−1 elements in each set. The possible sets for which the final selection step is performed may then be defined from sets containing these r elements, e.g. as all possible sets of q−1 elements containing these r elements, or some further subset of these sets of q−1 elements selected via a second threshold-estimation process.

The hierarchical partitioning processes described above can of course be extended to accommodate (q>4)-level cells, e.g. by repeated application of a dichotomization process. In general, where first and second threshold estimation processes are employed, these processes may be the same or different. For q>4, either process may involve a plurality of successive threshold estimation steps, e.g. successive dichotomization steps, which may use the same or different threshold-estimation techniques. Various distance functions can be used in these processes, and various difference functions can be employed for the final selection step.

A different form of average value, e.g. a mean, median, mode (most commonly occurring) value or some form of weighted average, may be used in the above methods if desired. Also, weights may be determined differently in other embodiments, e.g. according to predetermined level dependencies for the user data.

While memory 2 uses PCM cells, the techniques described are generic and can of course be applied to other memory cells.

Methods embodying this invention may provide for self-adaptive determination of level-thresholds on readout of q-level memory cells. Embodiments of the invention may be robust to small readback block size, offering excellent performance even at block sizes of 128 bits or less. Methods embodying the invention may be also robust to data asymmetries in the readback signals, and can be implemented with low system complexity. Methods embodying the invention may thus offer significant improvements for read-detection in q-level memory devices.

While application to SLC memory can be envisaged, methods embodying the invention are particularly advantageous for multi-level memory, i.e. q>2.

The signal level vector is indicative of the distribution of read signal components in order of signal level. In some embodiments, the signal level vector may be produced by ordering the read signal components according to signal level. Thus, while additional processing steps might also be envisaged, the signal level vector may simply be the vector produced by sorting the batch of read signal components into signal level order, i.e. in order of increasing or decreasing signal level. In other embodiments, the signal level vector may be produced by binning the read signal components according to signal level. While additional processing steps might again be envisaged, the signal level vector may then be defined by the resulting bin counts for the bins in signal level order.

The plurality of possible sets of q−1 elements may be defined directly or indirectly, e.g. in terms of an index k ($1 \leq k \leq N$) of an element in an N-element signal level vector, or by defining the numbers of elements in the q segments into which the vector is partitioned. Note that, as segment size is dependent on the number of read signal components corresponding to a given cell level, a segment may contain zero elements if a read signal contains no components for a given cell level. In this case two level thresholds can be represented by the same element of the signal level vector. The step of defining the possible sets may also be an active step, involving processing to identify the possible sets, or may be a passive step. The possible sets may, for example, be defined implicitly by operation of the final selection step.

The predetermined difference function used in the final selection step may be evaluated for each of the possible sets of q−1 elements. Methods might be envisaged in which this difference function takes into account differences between elements bordering neighboring segments into which the vector is partitioned by a set of q−1 elements. However, in preferred embodiments, the difference function is dependent on differences in signal level for elements within each of the q segments. The q−1 level-thresholds for the cell-group are then determined by selecting from said possible sets that set for which the difference function has a minimum value. These embodiments thus select the set of q−1 elements for which the elements in the resulting segments of the signal level vector are most closely grouped, or clustered, together. Various difference functions can be envisaged here, e.g. some function of the L1 or L2 distances for elements in each segment as explained further below.

The plurality of possible sets of q−1 elements may be a subset of all possible sets in some embodiments. For example, methods may include determining said plurality of possible sets by processing the signal level vector in accordance with a first threshold-estimation process to obtain $1 \leq r < (q-1)$ elements of each of said possible sets. Hence, the first threshold-estimation process identifies a subset of r of the q−1 elements in each set. The possible sets for which the final selection step is performed may then be defined from sets containing these r elements, e.g. as all possible sets of q−1 elements containing these r elements.

Particularly preferred embodiments determine said plurality of possible sets by processing the signal level vector in accordance with a first threshold-estimation process to obtain L candidate subsets of $1 \leq r < (q-1)$ elements corresponding to respective level-thresholds which partition the signal level vector into (r+1) sections. For each candidate subset, the (r+1) sections are then processed in accordance with a second threshold-estimation process to obtain ((q−1)−r) elements corresponding to the remaining level-thresholds for that subset. This results in L candidate sets of q−1 elements which provide the possible sets for the final selection step. Where q is a power of two, the first and second threshold-estimation processes may collectively effect a hierarchical dichotomization of the signal level vector, whereby the vector is recursively divided in two.

In other embodiments, especially where the number N of elements in the signal level vector is small, the plurality of possible sets of q−1 elements may comprise all possible sets of q−1 elements corresponding to respective level-thresholds. The final selection step may then be performed by defining a graph to represent the possible element-sets, and processing the graph to select the optimal set which determines the q−1 level-thresholds. This will be described in more detail below.

According to an embodiment of a further aspect there is provided a computer program product for level-threshold determination, the computer program product comprising a computer readable storage medium having program instructions embodied therewith, the program instructions executable by an apparatus to cause the apparatus to perform a method according to the first aspect of the invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be appreciated that many other changes and modifications can be made to the embodiments described without departing from the scope of the invention.

What is claimed is:

1. A method for determining level-threshold of q-level memory cells, the method comprising:
   processing read signal components, of a group of memory cells, to produce a signal level vector, comprising a series of elements indicative of the distribution of read signal components;
   defining a plurality of possible sets of q−1 said elements corresponding, respectively, to q−1 level-thresholds which partition the signal level vector into q segments; and
   determining the q−1 level-thresholds for said group of memory cells by selecting from said possible sets a set based on the set's predetermined difference function.

2. The method according to claim 1, wherein:
   said difference function is dependent on differences in signal level for elements within each of the q segments; and
   the q−1 level-thresholds for said group are determined by selecting from said possible sets that set for which the difference function has a minimum value.

3. The method according to claim 1, further comprising evaluating said difference function for each of said possible sets.

4. The method according to claim 1, further comprising producing the signal level vector by ordering the read signal components according to signal level.

5. The method according to claim 1, further comprising producing the signal level vector by binning the read signal components according to signal level.

6. The method according to claim 1, wherein q>2.

7. The method according to claim 6, further comprising determining said plurality of possible sets by processing the signal level vector in accordance with a first threshold-estimation process to obtain $1 \leq r < (q-1)$ elements of each of said possible sets.

8. The method according to claim 6, further comprising determining said plurality of possible sets by:
   processing the signal level vector in accordance with a first threshold-estimation process to obtain L candidate subsets of $1 \leq r < (q-1)$ elements corresponding to respective level-thresholds which partition the signal level vector into (r+1) sections; and
   for each candidate subset, processing said (r+1) sections in accordance with a second threshold-estimation process to obtain ((q−1)−r) elements corresponding to the remaining level-thresholds for that subset.

9. The method according to claim 8, wherein q is a power of two and said first and second threshold-estimation processes collectively effect a hierarchical dichotomization of the signal level vector.

10. The method according to claim 9, wherein q=4 and r=1, and the method further comprising:
    for each candidate subset of r=1 element corresponding to a level-threshold which partitions the signal level vector into two sections, processing each section in accordance with the second threshold-estimation process to obtain one element corresponding to a said remaining level-threshold.

11. The method according to claim 9, wherein q=4 and r=1, and wherein:

the first threshold-estimation process comprises calculating differences between successive elements in the signal level vector and selecting, as the L candidate subsets of r=1 element, L candidate elements with the L greatest differences to the succeeding element; and for each candidate element corresponding to a level threshold which partitions the signal level vector into two sections, the second threshold-estimation process comprises selecting from each section X trial elements with the X greatest differences to the succeeding element, and selecting, as the two elements corresponding to said remaining level-thresholds, the pair of trial elements, corresponding to level thresholds which partition respective sections into two segments, which minimize a sum over the segments of a distance function comprising the L1 distance of elements within a segment from an average value for that segment.

12. The method according to claim 10, wherein at least one of the first and second threshold estimation processes for obtaining a said element corresponding to a level threshold comprises:

selecting the element which minimizes a sum, over said sections produced by that level-threshold, of a distance function comprising one of the L1 and L2 distances of elements within a section from an average value for that section.

13. The method according to claim 1, wherein:

said predetermined difference function comprises a sum over said segments of a distance function comprising one of the L1 and L2 distances of elements within each segment from an average value for that segment; and the q−1 level-thresholds for the group of memory cells are determined by selecting from said possible sets that set for which said difference function has a minimum value.

14. The method according to claim 1, wherein said plurality of possible sets comprises all possible sets of q−1 elements corresponding to respective level-thresholds.

15. The method according to claim 14, wherein the signal level vector comprises N elements and the q−1 level-thresholds for the group of memory cells are determined by:

defining a graph comprising an array of nodes, arranged in (N+1) states and (q+1) time-slices, interconnected by branches such that each path across the graph via interconnected nodes represents one of said possible sets of q−1 elements, wherein each branch is assigned a respective metric such that the metrics assigned to branches in a path indicate the value of said predetermined difference function for the corresponding set of q−1 elements; and processing the graph to identify the path for which the predetermined difference function has said optimal value.

16. The method according to claim 15, wherein:

said predetermined difference function comprises a sum over said segments of a distance function comprising one of the L1 and L2 distances of elements within a segment from an average value for that segment; and the method includes processing the graph using the Viterbi algorithm to identify the path for which the predetermined difference function has a minimum value.

17. An apparatus for level-threshold determination on readout of q-level memory cells, the apparatus comprising working memory for storing respective read signal components obtained by reading a group of said q-level memory cells, and control logic adapted to:

process the read signal components to produce a signal level vector, comprising a series of elements indicative of the distribution of read signal components;

define a plurality of possible sets of q−1 said elements corresponding, respectively, to q−1 level-thresholds which partition the signal level vector into q segments; and determine the q−1 level-thresholds for said group of memory cells by selecting from said possible sets based on the set's predetermined difference function.

18. The apparatus according to claim 17, wherein the control logic comprises a hardwired logic circuit.

19. A data storage device comprising:

a non-transitory memory having q-level memory cells;

a read/write apparatus for writing $q^{ary}$ symbols in respective memory cells and for reading memory cells to obtain respective read signal components each corresponding to a said symbol;

a level-threshold determination apparatus for receiving read signal components for a group of memory cells and determining therefrom q−1 level-thresholds for the group; and a detector for detecting $q^{ary}$ symbols corresponding to said read signal components in dependence on the level-thresholds so determined, and wherein the level-threshold determination apparatus comprises working memory for storing respective read signal components obtained by reading a group of said q-level memory cells, and control logic adapted to:

process the read signal components to produce a signal level vector, comprising a series of elements indicative of the distribution of read signal components;

define a plurality of possible sets of q−1 said elements corresponding, respectively, to q−1 level-thresholds which partition the signal level vector into q segments; and determine the q−1 level-thresholds for said group of memory cells by selecting from said possible sets based on the set's predetermined difference function.

20. The data storage device according to claim 19, wherein said q-level memory cells comprise phase-change memory cells.

* * * * *